United States Patent
Liao et al.

(10) Patent No.: US 9,385,316 B2
(45) Date of Patent: Jul. 5, 2016

(54) RRAM RETENTION BY DEPOSITING TI CAPPING LAYER BEFORE HK HFO

(71) Applicant: Taiwan Semiconductor Manufacturing Co., Ltd., Hsin-Chu (TW)

(72) Inventors: Yu-Wen Liao, New Taipei (TW);
Wen-Ting Chu, Kaohsiung (TW);
Tong-Chern Ong, Chong-Her (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 98 days.

(21) Appl. No.: 14/196,416

(22) Filed: Mar. 4, 2014

(65) Prior Publication Data

US 2015/0194602 A1    Jul. 9, 2015

Related U.S. Application Data

(60) Provisional application No. 61/924,504, filed on Jan. 7, 2014.

(51) Int. Cl.
*H01L 45/00* (2006.01)
*H01L 27/24* (2006.01)

(52) U.S. Cl.
CPC .......... *H01L 45/146* (2013.01); *H01L 27/2436* (2013.01); *H01L 45/08* (2013.01); *H01L 45/1233* (2013.01); *H01L 45/1253* (2013.01); *H01L 45/1675* (2013.01)

(58) Field of Classification Search
CPC ... H01L 45/146; H01L 45/1253; H01L 45/08; H01L 45/1233; H01L 45/1675; H01L 27/2436
USPC .................. 365/148; 257/288, 211
See application file for complete search history.

(56) References Cited

U.S. PATENT DOCUMENTS

| 6,004,188 | A | * | 12/1999 | Roy ............................... 451/41 |
| 6,849,891 | B1 | | 2/2005 | Hsu et al. |
| 7,169,637 | B2 | | 1/2007 | Zhang et al. |

(Continued)

FOREIGN PATENT DOCUMENTS

WO    2009126891 A1    10/2009

OTHER PUBLICATIONS

Wong, et al. "Metal-Oxide RRAM" Proceeding of the IEEE, vol. 100, No. 6, Jun. 2012. pp. 1951-1970.*

(Continued)

*Primary Examiner* — Vu Le
*Assistant Examiner* — Sung Cho
(74) *Attorney, Agent, or Firm* — Eschweiler & Associates, LLC

(57) ABSTRACT

The present disclosure relates to a resistance random access memory (RRAM) device architecture where a Ti metal capping layer is deposited before the deposition of the HK HfO resistance switching layer. Here, the capping layer is below the HK HfO layer, and hence no damage will occur during the top RRAM electrode etching. The outer sidewalls of the capping layer are substantially aligned with the sidewalls of the HfO layer and hence any damage that may occur during future etching steps will happen at the outer side walls of the capping layer that are positioned away from the oxygen vacancy filament (conductive filament) in the HK HfO layer. Thus the architecture in the present disclosure, improves data retention.

19 Claims, 8 Drawing Sheets

(56) References Cited

U.S. PATENT DOCUMENTS

| | | | |
|---|---|---|---|
| 7,388,771 B2* | 6/2008 | Ho | B82Y 10/00 365/148 |
| 7,407,858 B2 | 8/2008 | Li et al. | |
| 7,795,606 B2 | 9/2010 | Jin et al. | |
| 8,000,128 B2 | 8/2011 | Li et al. | |
| 8,009,454 B2 | 8/2011 | Lee et al. | |
| 8,213,216 B2 | 7/2012 | Wang et al. | |
| 8,450,714 B2* | 5/2013 | Yasutake | G11C 13/0004 257/3 |
| 8,618,525 B2* | 12/2013 | Wang | H01L 45/04 257/1 |
| 8,642,985 B2* | 2/2014 | Chen | G11C 13/003 257/1 |
| 8,963,114 B2 | 2/2015 | Liao et al. | |
| 9,040,952 B2* | 5/2015 | Ha | H01L 45/1253 257/1 |
| 2005/0124112 A1 | 6/2005 | Hsu et al. | |
| 2007/0117315 A1* | 5/2007 | Lai et al. | 438/257 |
| 2008/0315174 A1* | 12/2008 | Kang | H01L 27/115 257/4 |
| 2009/0073741 A1* | 3/2009 | Liu | G11C 13/0004 365/148 |
| 2010/0007344 A1* | 1/2010 | Guo | G01R 33/098 324/260 |
| 2011/0007552 A1 | 1/2011 | Ahn et al. | |
| 2012/0064682 A1* | 3/2012 | Jang | H01L 21/28273 438/268 |
| 2012/0147649 A1* | 6/2012 | Samachisa et al. | 365/51 |
| 2012/0175580 A1* | 7/2012 | Song | H01L 45/06 257/1 |
| 2012/0214262 A1* | 8/2012 | Yu | H01L 27/088 438/15 |
| 2012/0261636 A1 | 10/2012 | Zhou et al. | |
| 2013/0095633 A1* | 4/2013 | Kakegawa | H01L 45/04 438/382 |
| 2013/0112935 A1* | 5/2013 | Himeno | H01L 45/1253 257/4 |
| 2013/0114325 A1* | 5/2013 | Lin | G11C 14/009 365/148 |
| 2014/0145135 A1* | 5/2014 | Gee | H01L 45/085 257/2 |
| 2014/0175359 A1* | 6/2014 | Wang | H01L 45/145 257/2 |
| 2015/0016174 A1* | 1/2015 | Liu | H01L 27/11206 365/96 |
| 2015/0029779 A1* | 1/2015 | Lee | G11C 13/0004 365/148 |

OTHER PUBLICATIONS

Wong, et al. "Metal-Oxide RRAM." Proceedings of the IEEE, vol. 100, No. 6, Jun. 2012. 20 Pages.

U.S. Appl. No. 14/196,361, filed Mar. 4, 2014. 26 Pages.

* cited by examiner

RRAM RETENTION BY DEPOSITING TI CAPPING LAYER BEFORE HK HFO

CROSS-REFERENCE TO RELATED APPLICATION

This application claims priority to U.S. provisional patent application 61/924,504 filed on Jan. 7, 2014, entitled "improvement of RRAM retention by depositing Ti capping layer before HK HfO", the contents of which are hereby incorporated by reference.

BACKGROUND

Non-volatile memories are used in a wide variety of commercial and military electronic devices and equipment. Resistance random access memory (RRAM) is one promising candidate for next generation non-volatile memory technology due to its simple structure and CMOS logic compatible process technology that is involved. Each RRAM cell includes a metal oxide material sandwiched between top and bottom electrodes. This metal oxide material has a variable resistance whose resistance level corresponds to a data state stored in the RRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
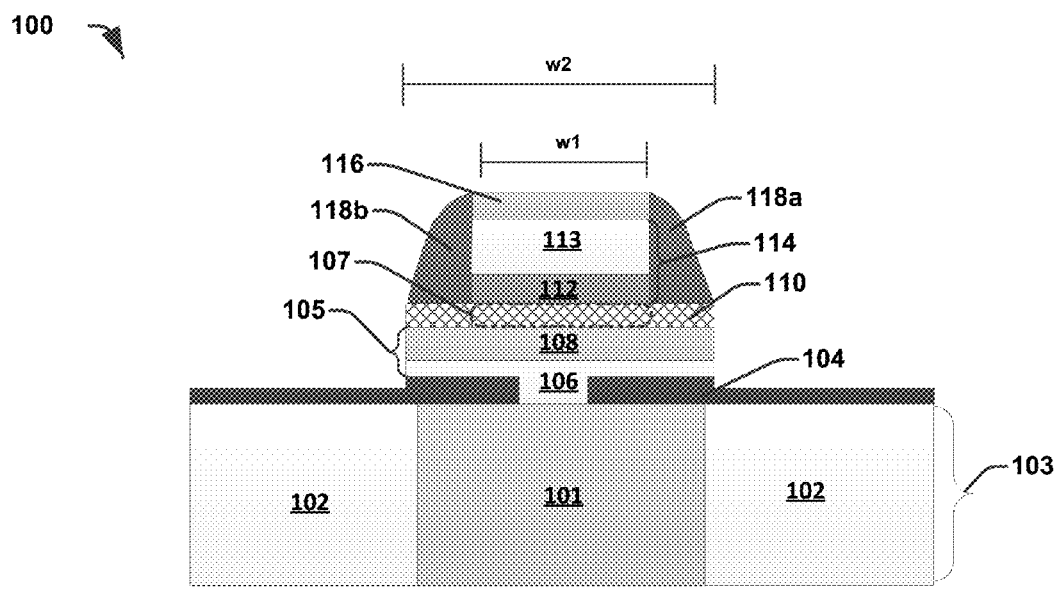
FIG. 1 illustrates a cross sectional view of an RRAM stack according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A conventional RRAM cell includes an upper (anode) electrode and a lower (cathode) electrode with a variable resistance dielectric layer placed between the two electrodes. The upper electrode is made up of a bipolar switching layer and a metal capping layer, both of which share an upper electrode width as measured between outer upper electrode sidewalls. The variable resistance dielectric layer and lower electrode have a lower electrode width, which is less than that of the upper electrode. During write operations to the RRAM cell, a 'set' voltage can be applied across the upper and lower electrodes to change the variable resistance dielectric layer from a first resistivity to a second resistivity. Similarly, a 'reset' voltage can be applied across the electrodes to change the variable resistance dielectric layer from the second resistivity back to the first resistivity. Therefore, in instances where the first and second resistance states correspond to logical "1" and logical "0" states (or vice versa), respectively, the 'set' and 'reset' voltages can be used to store digital data in the RRAM cell.

It is believed that the mechanism by which this resistance switching occurs has to do with selectively conductive filaments which are arranged within the variable resistance dielectric layer. These selectively conductive filaments are initially formed at the end of the RRAM manufacturing process, when a forming voltage is applied across the anode and cathode electrodes. This forming voltage produces a high electric field, which knocks oxygen atoms out of the lattice of the variable resistance dielectric layer, thereby forming localized oxygen vacancies. These localized oxygen vacancies tend to align to form "filaments" which are relatively permanent and which extend between the upper and lower electrodes. During write operations, the resistance of these filaments can be changed by "stuffing" them with oxygen atoms or by "stripping" oxygen atoms from them. For example, when a first voltage is applied (e.g., a "set" voltage), oxygen atoms are depleted from the metal capping layer and injected into the filaments to provide a first resistivity; whereas when a second voltage is applied (e.g., a "reset" voltage), oxygen atoms are stripped from the filaments and injected into the metal capping layer to provide a second resistivity. Whatever the precise mechanism, it is believed that the movement of oxygen molecules between the metal capping layer, which can act as an oxygen reservoir, and the filaments dictates in large part the 'set' and 'reset' resistances of the RRAM cell.

Unfortunately, in a conventional RRAM manufacturing process, an etch used to form the relatively narrow upper electrode structure can at least partially oxidize outer sidewalls of the metal capping layer. During subsequent thermal steps (e.g., baking or annealing), oxygen can undesirably diffuse from this partially oxidized metal capping layer to recombine with the oxygen vacancies in the filaments. For some RRAM cells, this can effectively "pin" some filaments to one of the two variable resistance states, such that those RRAM cells may have data retention issues.

Accordingly, the present disclosure relates to a new architecture for RRAM cells, where the anode structure (including the metal capping layer) is disposed below the variable resistance dielectric layer and becomes part of the relatively wide bottom electrode. This way, the metal capping layer will be formed below the variable resistance dielectric layer (i.e., the anode is now formed beneath the variable resistance dielectric layer) and hence will not be oxidized when the top electrode is etched. Further, because the metal capping layer is now part of the relatively-wide bottom electrode, any sidewall oxidation for the metal capping layer occurs at a safe distance from the filament region in the variable resistance dielectric layer. Thus, the effective change in resistance between the 'set' and 'reset' resistances is well defined, making it easier to discern between high resistance and low-resistance states.

FIG. 1 illustrates a cross sectional view of an RRAM stack 100 according to some embodiments of the present disclosure. The RRAM stack 100 includes an upper (cathode) electrode 114 and a lower (anode) electrode 105 with a variable resistance dielectric layer 110 there between. The variable resistance dielectric layer 110 includes a filament region 107 where filaments are formed. In some embodiments, the variable resistance dielectric layer 110 comprises HK (high k) HfO (hafnium oxide).

The RRAM stack 100 resides over a semiconductor work-piece 103 comprising a conductive metal region 101 which has extremely low-k dielectric regions 102 on either side. Right above the semiconductor work-piece 103 resides a dielectric protection layer 104 having an open region above the metal region 101, wherein sidewalls of dielectric protection layer 104 culminate above the metal region 101. Above the dielectric protection layer 104 resides an anode 106 which abuts the conductive metal region 101 through the opening in the dielectric protection layer 104. In some embodiments the anode 104 comprises a transitional nitride layer. Above the anode 106, a metal capping layer 108 is disposed. In some embodiments, the metal capping layer 108 comprises Ti, Ta (tantalum) or Hf (hafnium) and acts as an oxygen reservoir. A variable resistance dielectric layer 110 abuts the entire top surface of the metal capping layer 108. The variable resistance dielectric layer 110, the metal capping layer 108, and the anode 106 have vertical side walls that are aligned to one another. A cathode 114 resides above the variable resistance dielectric layer 110 at a defined center region of the variable resistance dielectric layer. The cathode 114 has a first width w1 as measured between its outer sidewalls, and the variable resistance dielectric layer 110 and the metal capping layer 108 each have a second width w2 as measured between their respective outer sidewalls. In some embodiments, the second width w2 is greater than the first width. In one embodiment the cathode 114 comprises a first transitional nitride layer 112 and a second transitional nitride layer 113 that resides on top of first transitional nitride layer 112. A pair of sidewall spacers 118a and 118b is disposed on either side of the cathode 114. The spacers 118a and 118b also reside on the two end locations of the variable resistance dielectric layer 110. The cathode 114 has outer sidewalls that directly abut corresponding inner sidewalls of the sidewall spacers 118a and 118b. An antireflective layer 116 is disposed above the top electrode 114. The antireflective layer 116 and the cathode 114 have vertical sidewalls that are aligned to one another.

As will be appreciated in greater detail below, the metal capping layer 108 which can comprise Ti in some embodiments is deposited before the variable resistance dielectric layer 110 unlike traditional methods. In other words, the anode 106 and cathode 114 have been flipped relative to convention solutions and the metal capping layer 108 now becomes part of the bottom electrode 105. This architecture will position the outer side walls of the oxidation prone metal capping layer 108 away from the filament region 107 of the variable resistance dielectric layer 110 as the outer side walls of the variable resistance dielectric layer 110 and the metal capping layer 108 are substantially aligned with one another. Thus, any oxidation that may happen at the outer side walls of the metal capping layer 108 will not impair the filaments of the variable resistance dielectric layer 110 and thus data retention is improved.

Figure 2:
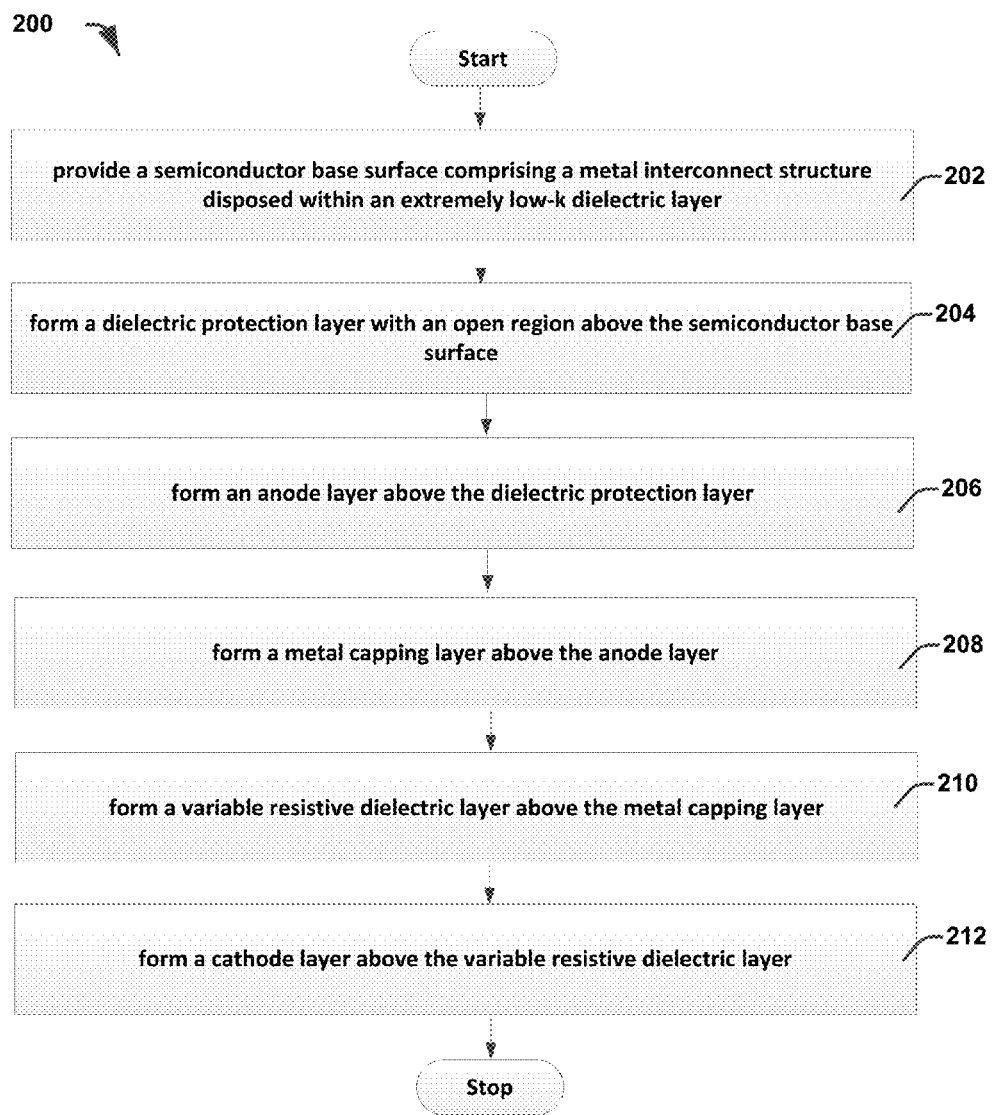
FIG. 2 illustrates a flow diagram of some embodiments of a method for forming an RRAM stack with a Ti capping layer formed before the HK (high k) HfO (hafnium oxide) dielectric layer, according to the present disclosure.

FIG. 2 illustrates a flow diagram 200 of some embodiments of a method for forming an RRAM stack with a Ti capping layer formed before the HK HfO according to the present disclosure. While disclosed method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a semiconductor base surface comprising a metal interconnect structure disposed within an extremely low-k dielectric layer is provided. In some embodiments, the metal interconnect structure comprises copper.

At 204, dielectric protection layer with an open region is formed above the semiconductor base surface. In some embodiments, the dielectric protection layer comprises SiC.

At 206, an anode layer is formed above the dielectric protection layer. In some embodiments, the anode comprises TaN.

At 208, a metal capping layer is formed above the anode. In some embodiments, the metal capping layer comprises Ti.

At 210, a variable resistance dielectric layer is formed above the metal capping layer. In some embodiments, the variable resistance dielectric layer comprises hafnium oxide (HfO).

At 212, a cathode layer is formed above the variable resistance dielectric layer. In some embodiments, the cathode comprises a first transitional nitride layer with a second transitional nitride layer above it. In some embodiments, transitional nitride layers comprise TaN and TiN. For example, the first transitional nitride layer can be TaN, and the second overlying transitional nitride layer can be TiN.

Figure 3:
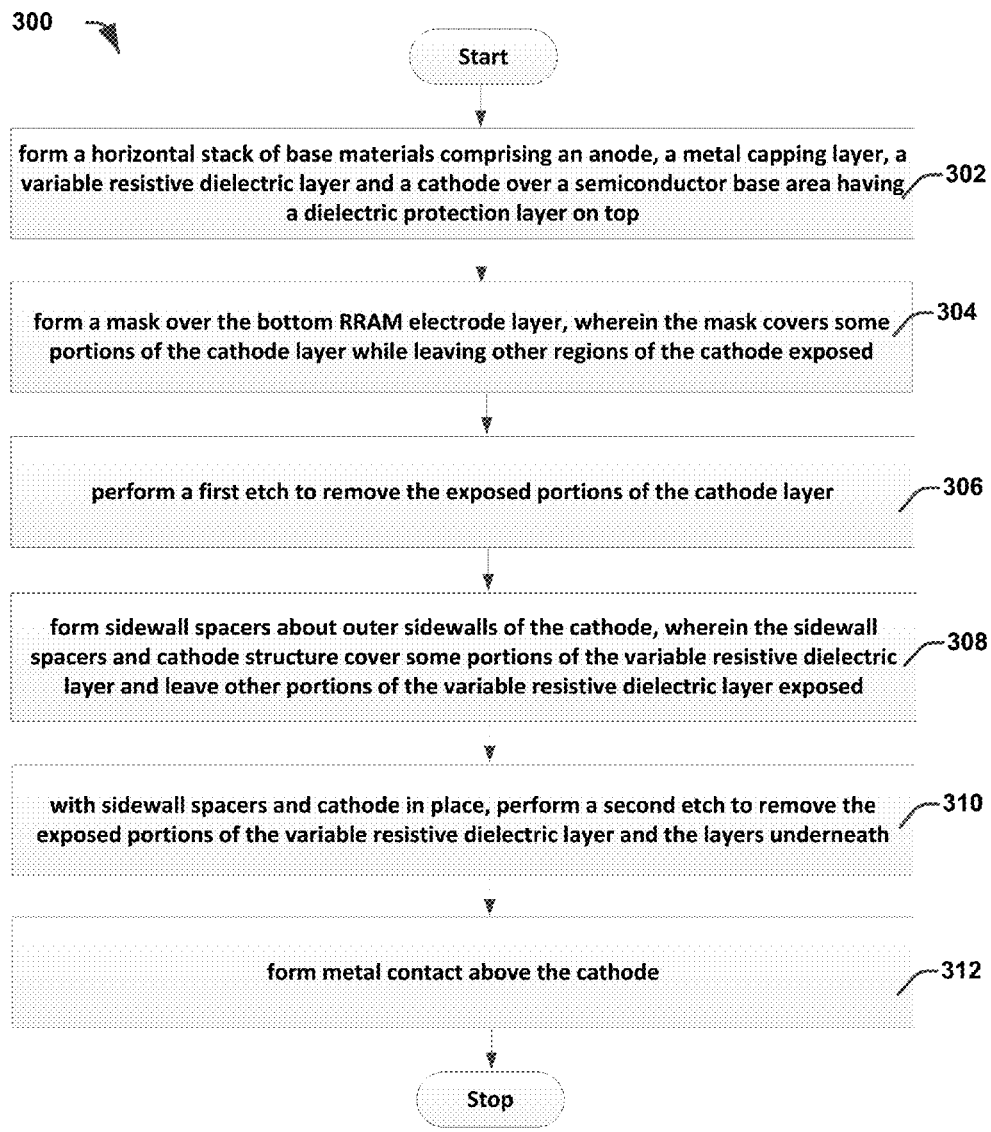
FIG. 3 illustrates a flow diagram of some embodiments of a step by step method for forming an RRAM stack according to the present disclosure.

FIG. 3 illustrates a flow diagram of some embodiments of a step by step method 300 for forming an RRAM stack according to the present disclosure. While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a horizontal stack of base materials comprising an anode, a metal capping layer, a variable resistance dielectric layer and a cathode is formed over a semiconductor base area having a dielectric protection layer on top.

At 304, a mask is formed over the cathode layer. The mask covers some portions of the cathode layer while leaving other regions of cathode exposed.

At 306, a first etch is performed to remove exposed portions of the cathode layer and form a cathode structure. In some embodiments, the first etch comprises a dry etch comprising chlorine based (Cl2/BCl2) or fluorine based (CF4/CHF3/CH2/SF6) etchants.

At 308, sidewall spacers are formed about the outer sidewalls of the cathode. The sidewall spacers and the cathode structure cover some portions of the variable resistance dielectric layer and leave other portions of the variable resistance dielectric layer exposed. In some embodiments, the cathode comprises TaN over TiN, and the sidewall spacer material comprises SiN (silicon nitride).

At 310, a second etch is performed to remove exposed portions of the variable resistance dielectric layer. With the sidewall spacers and the cathode structure in place, performing a second etch removes the exposed portions of the variable resistance dielectric layer as well as underlying metal capping layer and the anode. The second etch stops at the dielectric protection layer. In some embodiments, the anode comprises TaN. In some embodiments, the second etch comprises a dry etch comprising chlorine based (Cl2/BCl2) or fluorine based (CF4/CHF3/CH2/SF6) etchants.

At 312 metal contact is formed above the cathode structure which is further connected to a source line during set operation and to a bit line during reset operation.

FIGS. 4-10 illustrate embodiments of cross sectional images of the step by step method for the formation of an RRAM stack with a Ti capping layer formed beneath the HK HfO according to the present disclosure.

Figure 4:
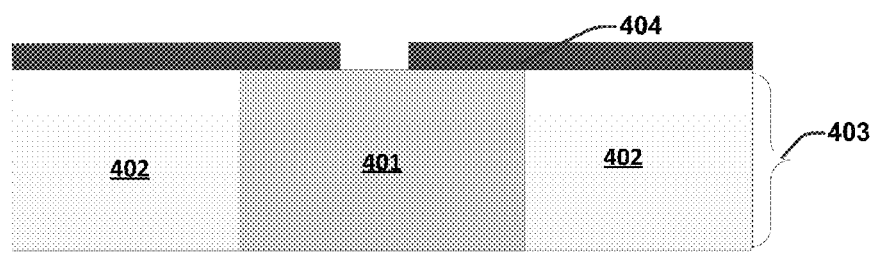
FIGS. 4-10 illustrate embodiments of cross sectional images of a step by step method of formation of an RRAM stack with a Ti capping layer formed beneath the HK HfO dielectric layer, according to the present disclosure.

FIG. 4 illustrates a cross sectional image 400 of a semiconductor body having dielectric protection layer 404 over a semiconductor work-piece 403. The semiconductor work-piece 403 comprises a metal interconnect structure 401 disposed within extremely low-k dielectric regions 402. In some embodiments, the metal interconnect structure 401 comprises copper (Cu) and the extremely low-k dielectric regions 402 comprises porous silicon dioxide, fluorinated silica glass, polyimides, polynorbornenes, benzocyclobutene, or PTFE. The dielectric protection layer 404 has an opening towards the center which is created using a masked lithography step. This opening leaves a portion of the metal interconnect structure 401 exposed. In some embodiments, the dielectric protection layer 404 comprises SiC.

Figure 5:
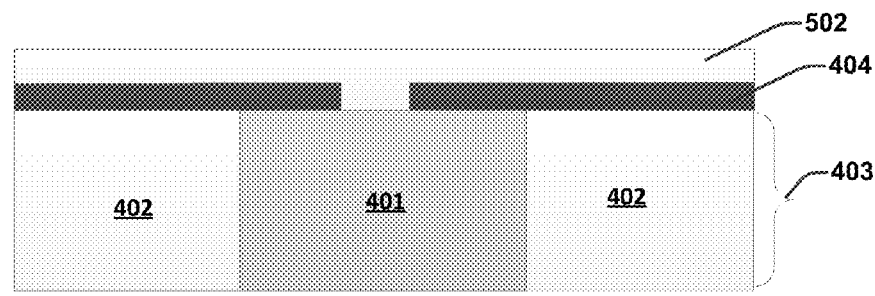

FIG. 5 illustrates a cross sectional image 500 of a semiconductor body at a subsequent stage in processing in which an anode 502 is disposed above the structure in image 400. Through the opening in the dielectric protection layer 404, the anode 502 touches the metal interconnect structure 401, which later couples the RRAM stack to the rest of the device.

Figure 6:
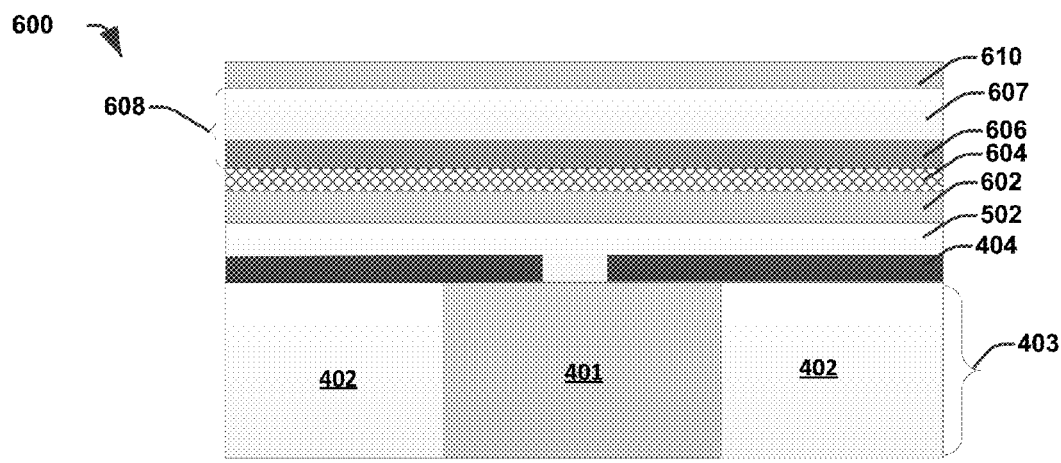

FIG. 6 illustrates a cross sectional image 600 of a semiconductor body at a subsequent stage in processing in which a horizontal stack of base materials. The stack of materials comprising an anode 502, a metal capping layer 602, a variable resistance dielectric layer 604, a cathode 608, and an anti-reflective layer 610, is formed over a semiconductor base area 403. In some embodiments, the anode 502 comprises TaN, the metal capping layer 602 comprises Ti, the variable resistance dielectric layer 604 comprises HfO, the cathode 608 comprises a first transitional nitride layer 606 comprising TiN and a second transitional nitride layer 607 comprising TaN over it, and the anti-reflective layer 610 comprises SiON.

Figure 7:
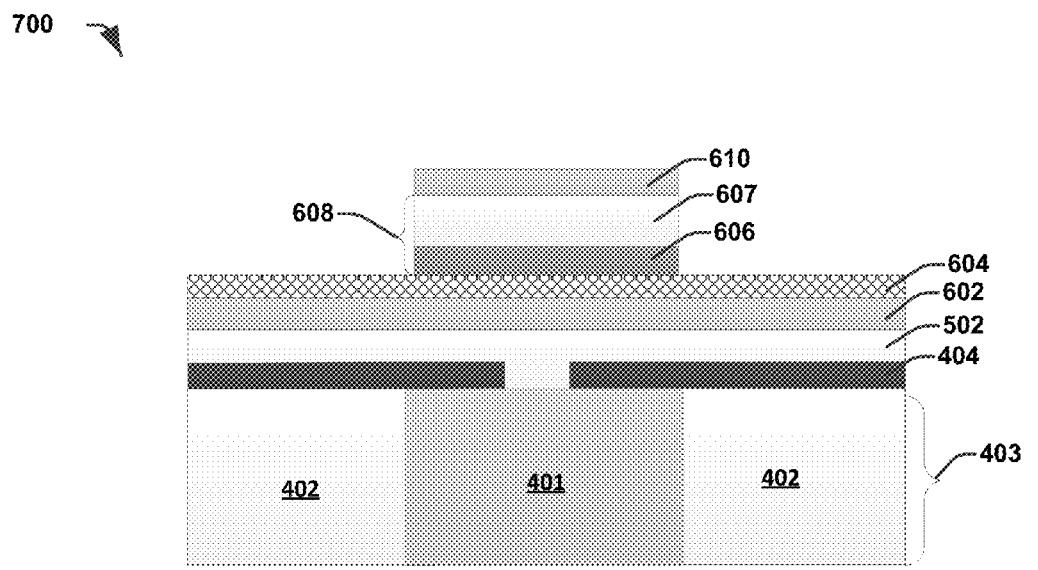

FIG. 7 illustrates a cross sectional image 700, at a subsequent stage in processing in which a cathode mask (not shown) has been formed over the horizontal stack 600 and a first etch is performed. After the first etch, a cathode structure comprising the cathode 608 and the antireflective layer 610 is formed at the center of the variable resistance dielectric layer 604 leaving exposed portions of the variable resistance dielectric layer 604 on either side.

Figure 8A:
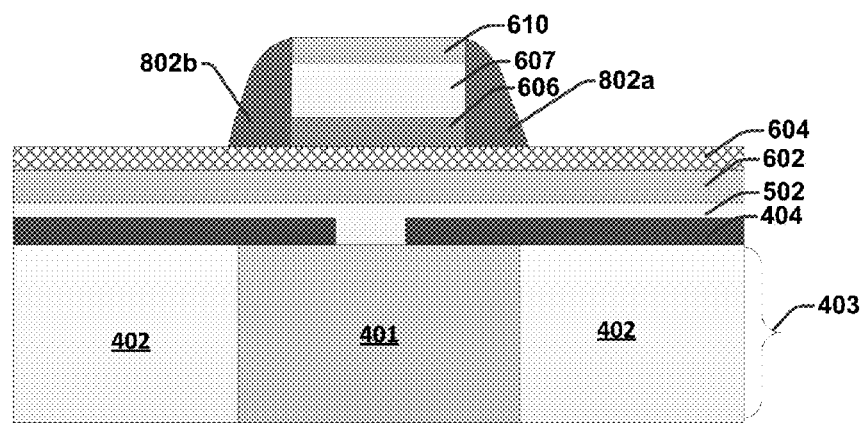

FIG. 8A illustrates a cross sectional image 800a, after forming spacers 802a and 802b on either side of the cathode structure. In some embodiments, the spacer material comprises silicon nitride (SiN). Typically the spacers 802a, 802b are formed by removing the cathode mask and then depositing a conformal layer of spacer material over the work-piece. The deposited layer is then etched to remove a vertically uniform depth of spacer material from over the work-piece, thereby leaving spacers 802a, 802b in place.

Figure 8B:
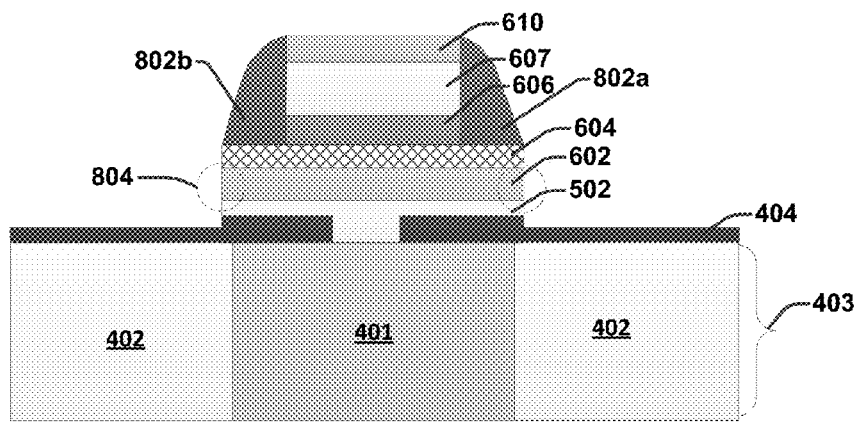

FIG. 8B illustrates a cross sectional image 800b, after performing a second etch on the semiconductor body in FIG. 8A. With the sidewall spacers 802a and 802b and cathode structure in place, performing a second etch would remove the exposed portions of the variable resistance dielectric layer 604 as well as underlying portions of the anode 502 and the capping layer 602, to form an anode structure. The second etch stops at the dielectric protection layer 404 such that the anode structure covers some portions of the dielectric protection layer 404 while leaving other portions of the dielectric protection layer 404 exposed. Oxidized regions 804 are seen abutting outer sidewalls of the metal capping layer 602.

Figure 9:
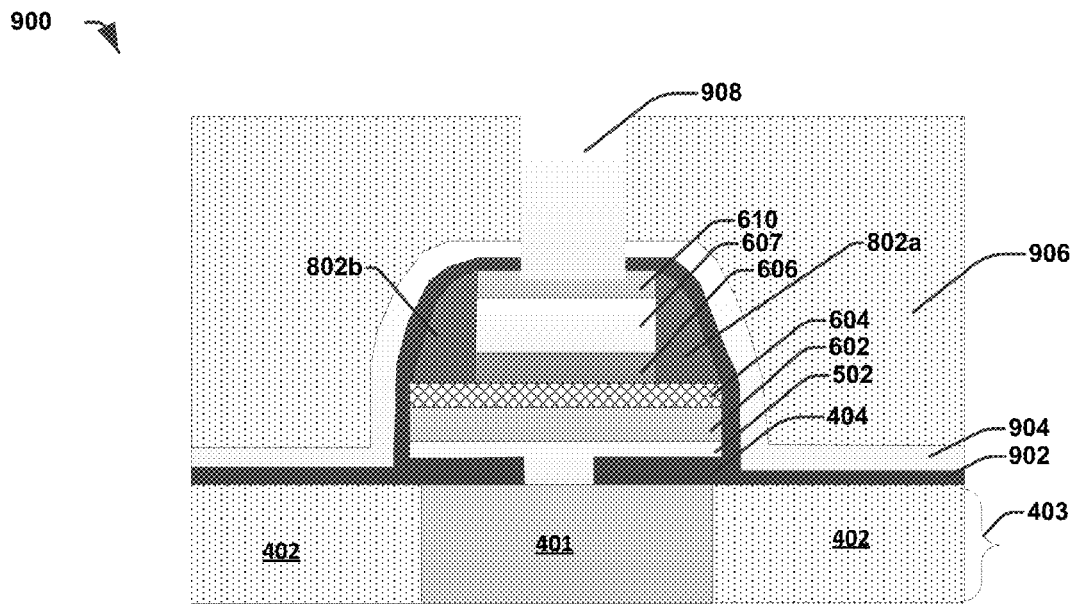

FIG. 9 illustrates a cross sectional image 900, after depositing the dielectric protection layer 902 and an insulating layer 904, all over the RRAM structure. In some embodiments, the insulating layer 904 comprises SiON. These layers insulate and protect each RRAM cell from current leakage and charge diffusion. Further, an interlayer dielectric 906 is formed over and around the insulating layer 904. An etched region 908 for a top electrode contact via (TEVA) is formed, which extends in to the cathode.

Figure 10:
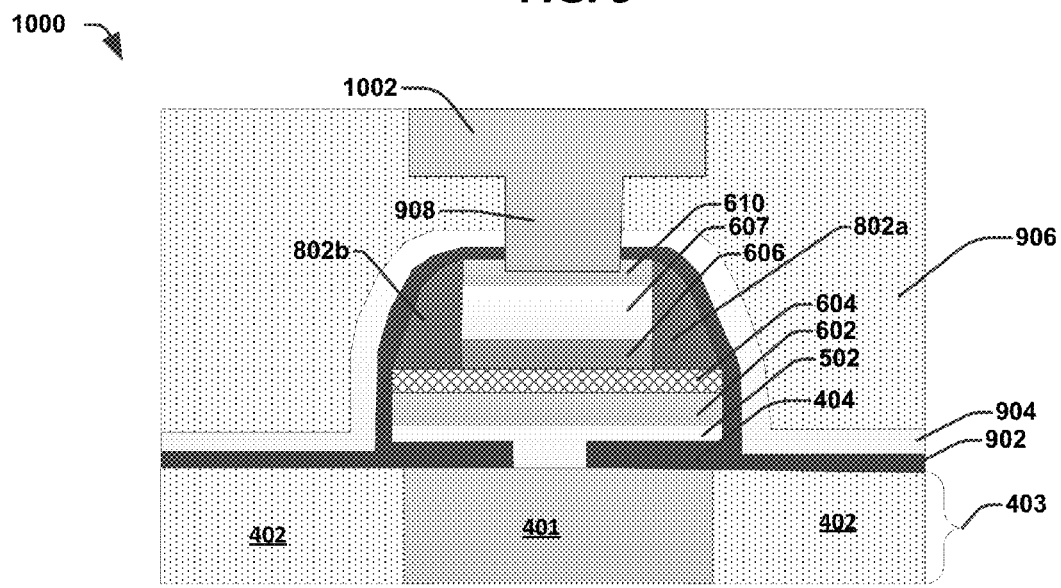

FIG. 10 illustrates a cross sectional image 1000, after forming TEVA 908 and a top metal contact 1002. In some embodiments, the thickness of the cathode layer is approximately 220 Angstroms, a thickness of the metal capping layer is approximately 100 Angstroms, a thickness of the variable dielectric layer is approximately 50 Angstroms, a thickness of the anode TiN layer is approximately 100 Angstroms, a thickness of the anode TaN layer is approximately 250 Angstroms.

Figure 11:
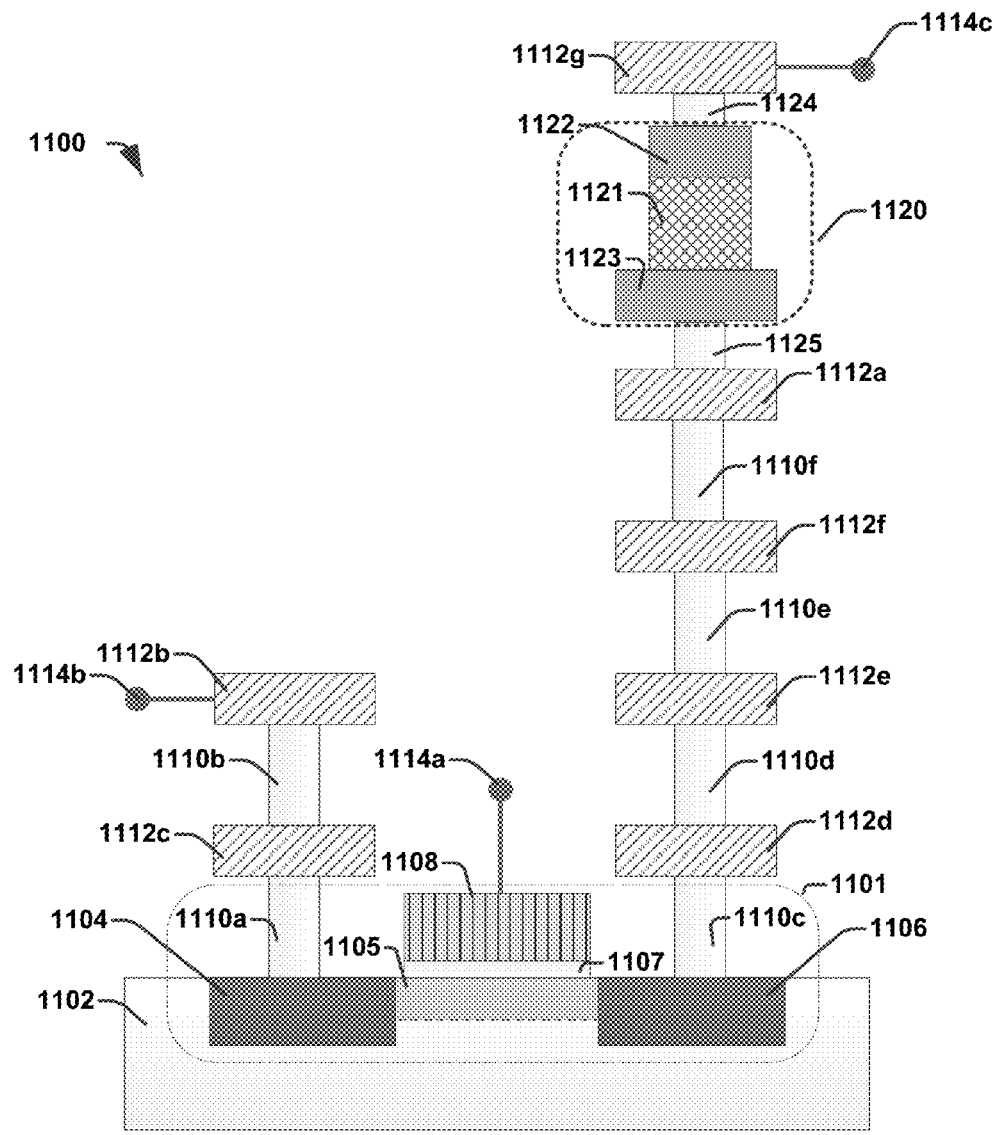
FIG. 11 illustrates a cross sectional view of some embodiments of an RRAM device with an RRAM stack that has a Ti capping layer formed beneath the HK HfO according to the present disclosure.

FIG. 11 illustrates a cross sectional view 1100 of some embodiments of an RRAM device with an RRAM stack that has a Ti capping layer formed beneath the HK HfO according to the present disclosure. A plurality of such RRAM devices form a memory array configured to store data. FIG. 11 comprises a conventional planar MOSFET selection transistor 1101 to suppress sneak-path leakage (i.e., prevent current intended for a particular memory cell from passing through an adjacent memory cell) while providing enough driving current for memory cell operation. The selection transistor 1101 comprises a source region 1104 and a drain region 1106 comprised within a semiconductor body 1102, separated horizontally by a channel region 1105. A gate electrode 1108 is located on the semiconductor body 1102 at a position that is above the channel region 1105. In some embodiments, the gate electrode 1108 comprises poly silicon but can also be metal. The gate electrode 1108 is separated from the source 1104 and drain 1106 by a gate oxide layer or gate dielectric layer 1107 extending laterally over the surface of the semiconductor body 1102. The drain 1106 is connected to a data storage element or RRAM stack 1120 by way of a first metal interconnect 1112a. The source 1104 is connected by way of a first metal contact 1112b. The gate electrode is connected to a word line 1114a, the source is connected to a bit line 1114b through the first metal contact 1112b and the RRAM stack 1120 is further connected to a source line 1114c comprised within an upper metallization layer by way of a second metal contact 1112g. A desired RRAM device may be selectively accessed using word lines and bit lines for reading, writing and erasing operations. One or more metal contacts comprising 1112c, 1112d, 1112e, 1112f and metal contact vias comprising 1110a, 1110b, 1110c, 1110d, 1110e, 1110f etc. that helps in connecting the RRAM memory device with the external circuitry may be present between the drain 1106 and the second metal contact 1112g, and between the source 1104 and the first metal contact 1112b. In some embodiments, the metal contacts comprise copper (Cu).

The RRAM cell 1120 comprises a variable resistance dielectric layer 1121 sandwiched between a cathode 1122 and an anode 1123. A metal capping layer (not shown) is disposed between the variable resistance dielectric layer 1121 and the anode 1123. A top electrode via (TEVA) 1124 connects the cathode 1122 of the memory cell 1120 to the second metal contact 1112g and a bottom electrode via (BEVA) 1125 connects the anode 1123 of the RRAM cell 1120 to the first metal interconnect 1112a.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a resistance random access memory (RRAM) device having a metal capping layer that is deposited before the deposition of a variable resistance dielectric layer. This architecture will have the outer side walls of the metal capping layer substantially aligned with the outer side walls of the variable resistance dielectric layer, which will prevent side wall damage or partial oxidation of the metal capping layer during the etching process of the cathode or the electrode layer on top of the variable resistance dielectric layer. Thus whatever damage that may happen on the side walls of the oxidation prone metal capping layer will be positioned away from the filament region of the variable resistance dielectric layer and hence data retention will not be affected.

In some embodiments, the present disclosure relates to a resistance random access memory (RRAM) device comprising, a variable resistance dielectric layer having a top surface and a bottom surface, a cathode disposed over the variable resistance dielectric layer abutting the top surface, a metal capping layer disposed below the variable resistance dielectric layer abutting the bottom surface, and an anode disposed below the metal capping layer.

In another embodiment, the present disclosure relates to a resistance random access memory (RRAM) stack of an RRAM device comprising, a bottom electrode comprising TaN, a Ti (titanium) metal capping layer arranged over the bottom electrode, a HK-HfO (high-k hafnium oxide) variable resistance dielectric layer arranged over the Ti metal capping layer, and a top electrode comprising a TaN (tantalum nitiride) layer over a TiN (titanium nitride) layer.

In yet another embodiment, the present disclosure relates to a method of forming a resistance random-access memory (RRAM) stack comprising, providing a semiconductor base surface comprising a metal interconnect structure disposed within a low-k dielectric layer, forming a dielectric protection layer having an open region above the metal interconnect structure, wherein sidewalls of the open region of the dielectric protection layer end above the metal interconnect structure, depositing a top RRAM electrode layer above the dielectric protection layer, the top RRAM electrode touching the metal interconnect structure through the opening in the dielectric protection layer, depositing a metal capping layer above the top RRAM electrode layer, depositing a variable resistance dielectric layer above the metal capping layer, and depositing a bottom RRAM electrode layer above the variable resistance dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistance random access memory (RRAM) device comprising:
  a variable resistance dielectric layer having a top surface and a bottom surface;
  a cathode disposed over the variable resistance dielectric layer and abutting the top surface;
  a metal capping layer disposed below the variable resistance dielectric layer and abutting the bottom surface; and
  an anode disposed below the metal capping layer at a location vertically between the metal capping layer and a semiconductor body, wherein the anode comprises a bump protruding outward from a lower surface of the anode that faces away from the metal capping layer.

2. The RRAM device of claim 1, further comprising:
  a pair of sidewall spacers arranged laterally about outer sidewalls of the cathode, wherein the cathode has a first width as measured between the outer sidewalls;
  wherein the variable resistance dielectric layer and the metal capping layer each have a second width as measured between their respective outer sidewalls, wherein the second width is greater than the first width.

3. The RRAM device of claim 2, wherein the sidewall spacers comprise SiN (silicon nitride).

4. The RRAM device of claim 2, wherein outer sidewalls of the metal capping layer are spaced apart from a conductive filament region arranged under the cathode and residing within the variable resistance dielectric layer.

5. The RRAM device of claim 2, further comprising:
oxidized regions abutting outer sidewalls of the metal capping layer.

6. The RRAM device of claim 2, wherein the cathode has outer sidewalls that directly abut corresponding inner sidewalls of the sidewall spacers without oxidized regions between the cathode and sidewall spacers, and wherein the outer sidewalls of the cathode are disposed at locations near a center region of the variable resistance dielectric layer.

7. The RRAM device of claim 2, wherein outer sidewalls of the variable dielectric layer, the metal capping layer, and the anode are substantially aligned with each other.

8. The RRAM device of claim 1 wherein:
the cathode comprises a TaN (tantalum nitride) layer over a TiN (titanium nitride) layer;
the anode comprises a TaN layer;
the variable resistance dielectric layer comprises $HfO_2$ (hafnium oxide); and
the metal capping layer comprises Ti (titanium) or Ta (tantalum) or Hf (hafnium).

9. The RRAM device of claim 1, wherein:
the anode and the cathode have larger thicknesses than the metal capping layer.

10. The RRAM device of claim 1 further comprising:
a semiconductor base area comprising a metal interconnect structure disposed within an extremely low-k dielectric layer formed thereover
a dielectric protection layer having an open region above the metal interconnect structure, wherein sidewalls of the open region of the dielectric protection layer end above the metal interconnect structure.

11. A resistance random access memory (RRAM) stack of an RRAM device comprising:
a bottom electrode comprising TaN;
a Ti (titanium) metal capping layer arranged over the bottom electrode;
a HK-HfO (high-k hafnium oxide) variable resistance dielectric layer arranged over the Ti metal capping layer;
a top electrode comprising a TaN (tantalum nitride) layer over a TiN (titanium nitride) layer;
a pair of sidewall spacers arranged laterally about outer sidewalls of the top electrode, wherein the top electrode has a first width as measured between its outer sidewalls; and
wherein the HK-HfO variable resistance dielectric layer and the Ti metal capping layer each have a second width as measured between their respective outer sidewalls, wherein the second width is greater than the first width.

12. The RRAM device of claim 11, further comprising:
a semiconductor body having a source region and a drain region horizontally separated by a channel region;
a gate structure coupled to the channel region;
a first contact and a second contact disposed above the source and drain regions, respectively;
a first metal interconnect disposed above the drain region, residing below the second contact and electrically coupled to the second contact; and
the RRAM stack formed above the first metal interconnect.

13. A method of forming a resistance random-access memory (RRAM) stack comprising:
providing a semiconductor base surface comprising a metal interconnect structure disposed within a low-k dielectric layer;
forming a dielectric protection layer having an opening that extends from an upper surface of the dielectric protection layer to the metal interconnect structure;
depositing an anode layer above the dielectric protection layer, the anode layer touching the metal interconnect structure through the opening in the dielectric protection layer;
depositing a metal capping layer above the anode layer, wherein the metal capping layer is vertically separated from a semiconductor body by the anode layer;
depositing a variable resistance dielectric layer above the metal capping; and
depositing a cathode layer above the variable resistance dielectric layer.

14. The method of claim 13, further comprising:
forming a mask over the cathode layer, the mask covering some portions of the cathode layer while leaving other regions of the cathode layer exposed;
performing a first etch to remove the exposed portions of the cathode layer and to thereby form a cathode structure; and
forming sidewall spacers about outer sidewalls of the cathode structure, wherein the sidewall spacers and cathode structure cover some portions of the variable resistance dielectric layer and leave other portions of the variable resistance dielectric layer exposed.

15. The method of claim 14, further comprising:
with the sidewall spacers and cathode structure in place, performing a second etch to remove the exposed portions of the variable resistance dielectric layer as well as underlying portions of the anode layer and the metal capping layer, to thereby form an anode structure;
wherein the second etch stops at the dielectric protection layer.

16. The method of claim 15, further comprising:
forming a second dielectric protection layer and an insulating layer covering the RRAM stack,
forming contact vias coupled to the cathode structure; and
forming metal contacts coupling the RRAM stack to a source line.

17. The RRAM device of claim 1, further comprising:
a pair of sidewall spacers arranged laterally about outer sidewalls of the cathode.

18. The RRAM device of claim 1, wherein the metal capping layer has a greater width than the anode.

19. The method of claim 13, wherein the variable resistance dielectric layer is separated from the dielectric protection layer by the anode layer and the metal capping layer.

* * * * *